(12) United States Patent
Jensen et al.

(10) Patent No.: US 7,587,000 B2
(45) Date of Patent: *Sep. 8, 2009

(54) RADIO RECEIVER UTILIZING A SINGLE ANALOG TO DIGITAL CONVERTER

(75) Inventors: Henrik T. Jensen, Long Beach, CA (US); Hong Shi, Redondo Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/958,055

(22) Filed: Dec. 17, 2007

(65) Prior Publication Data
US 2008/0107206 A1    May 8, 2008

Related U.S. Application Data

(63) Continuation of application No. 10/132,847, filed on Apr. 25, 2002, now Pat. No. 7,310,386.

(51) Int. Cl.
*H04L 27/00* (2006.01)

(52) U.S. Cl. .................................... 375/316
(58) Field of Classification Search ............. 375/316
See application file for complete search history.

(56) References Cited

U.S. PATENT DOCUMENTS

| | | | | |
|---|---|---|---|---|
| 6,611,570 | B1 * | 8/2003 | Subramanian | 375/326 |
| 6,704,560 | B1 * | 3/2004 | Balteanu et al. | 455/33 |
| 7,145,972 | B2 * | 12/2006 | Kumar et al. | 375/349 |
| 7,158,574 | B2 * | 1/2007 | Vishakhadatta et al. | 375/259 |

* cited by examiner

*Primary Examiner*—Tesfaldet Bocure
(74) *Attorney, Agent, or Firm*—Garlick, Harrison & Markison; Kevin L. Smith; Shayne X. Short (57) ABSTRACT

A radio receiver includes a single analog to digital converter, a 1st digital mixing module, and a 2nd digital mixing module. The single analog to digital converter is coupled to convert the filtered IF signal into a digital IF signal, which includes information regarding an in-phase component and a quadrature component of a modulated RF signal. The 1st and 2nd mixing modules each receive the digital IF signal and mix the digital IF signal with an in-phase and quadrature digital local oscillation to produce a 1st baseband signal component and a 2nd baseband signal component.

15 Claims, 5 Drawing Sheets

FIG. 4
ADC 66

RADIO RECEIVER UTILIZING A SINGLE ANALOG TO DIGITAL CONVERTER

The present U.S. Utility patent application claims priority pursuant to 35 U.S.C. § 120, as a continuation, to the following U.S. Utility patent application which is hereby incorporated herein by reference in its entirety and made part of the present U.S. Utility patent application for all purposes:

1. U.S. Utility application Ser. No. 10/132,847, entitled "A Radio Receiver Utilizing a Single Analog to Digital Converter,", filed Apr. 25, 2002, pending.

TECHNICAL FIELD OF THE INVENTION

This invention relates generally to communication systems and more particularly to radio receivers used within such communication systems.

BACKGROUND OF THE INVENTION

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter converts data into RF signals by modulating the data in accordance with the particular wireless communication standard to an RF carrier directly or in one or more intermediate frequency stages to produce the RF signals.

As is also known, the receiver receives RF signals, removes the RF carrier frequency from the RF signals via one or more intermediate frequency (IF) stages to produce analog baseband signals, converts the analog low IF signals into digital low IF signals, and demodulates the digital baseband signals in accordance with a particular wireless communication standard to recapture the transmitted data. The analog low IF signals include an in-phase (I) component and a quadrature (Q) component. As such, the receiver includes two analog to digital converts to convert the analog I and Q signals into digital I and Q signals.

The demands for enhanced performance smaller sizes, lower power consumption, and reduced costs of wireless communication devices are increasing. As such, stringent performance and size criteria are placed on the components comprising the wireless communication device. For example, the performance requirements for the analog to digital converts to convert the analog I and Q signal components into digital signals are quite stringent requiring a complex circuit implementation. Such a complex circuit implementation requires a relatively large silicon area (i.e., integrated circuit real estate) and consumes a relatively significant amount of power.

Therefore, a need exists for reducing size and power consumption of the analog to digital conversion process in radio receivers.

SUMMARY

The present invention is directed to apparatus and methods of operation that are further described in the following Brief Description of the Drawings, the Detailed Description of the Drawings, and the claims. Other features and advantages of the present invention will become apparent from the following detailed description of the invention made with reference to the accompanying drawings.

DETAIL DESCRIPTION OF THE DRAWINGS

Disclosed herein is a radio receiver including a single analog to digital converter. Such a radio receiver that includes a single analog to digital converter, a $1^{st}$ digital mixing module and a $2^{nd}$ digital mixing module. The low noise amplifier is coupled to receive a modulated radio frequency (RF) signal, which may be amplified to produce an amplified modulated RF signal. The modulated RF signal may be modulated in accordance with any one of a plurality of wireless communication standards including Bluetooth, 802.11a, 802.11b, et cetera.

The analog to digital converter is coupled to convert an IF signal into a digital IF signal. The $1^{st}$ and $2^{nd}$ mixing modules each receive the digital IF signal and mix the digital IF signal with an in-phase and quadrature digital local oscillation to produce a $1^{st}$ baseband signal component and a $2^{nd}$ baseband signal component. For example, the $1^{st}$ baseband signal component may be an in-phase baseband digital signal and the $2^{nd}$ baseband signal component may be a quadrature baseband signal.

In an alternative embodiment, an apparatus for digital intermediate frequency to baseband conversion of a single digital IF signal includes processing that enables the apparatus to receive a single IF signal that corresponds to a modulated radio frequency signal. The processing allows the apparatus to analog-to-digitally convert the single IF signal to a single digital IF signal. The process further allows the apparatus to mix the single digital IF signal with a $1^{st}$ digital local oscillation to produce a $1^{st}$ digitally mixed signal. The processing further allows the apparatus to mix the single digital IF signal with a $2^{nd}$ digital local oscillation to produce a $2^{nd}$ digitally mixed signal. The processing further allows the apparatus to perform a decimation filter upon the $1^{st}$ and $2^{nd}$ digitally mixed signals to produce $1^{st}$ and $2^{nd}$ baseband signal components. The $1^{st}$ and $2^{nd}$ baseband signal components may be further processed to recapture transmitted data.

Figure 1:
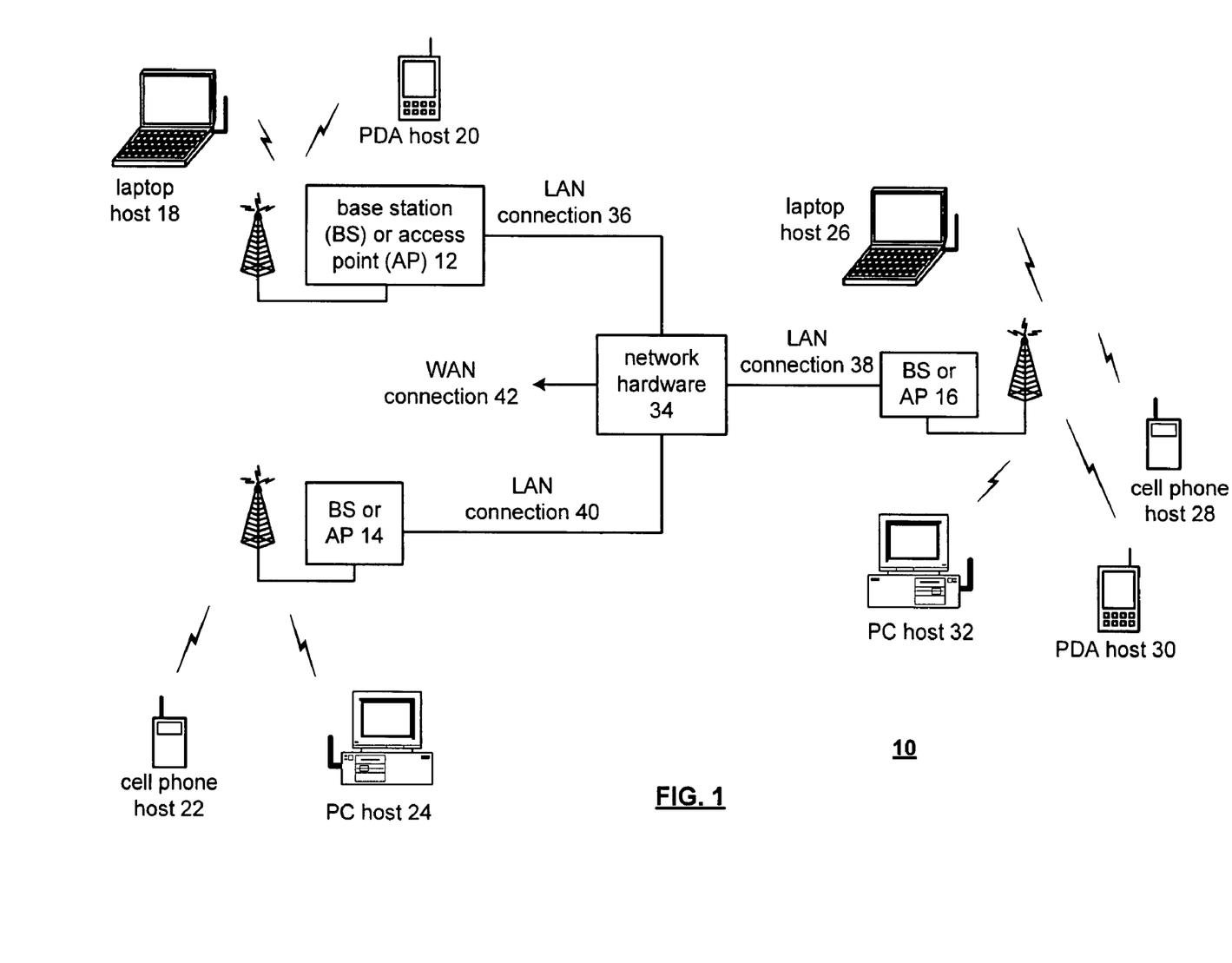
FIG. 1 illustrates a schematic block diagram of a communication system in accordance with the present invention.

FIG. 1 illustrates a schematic block diagram of a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12 are coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
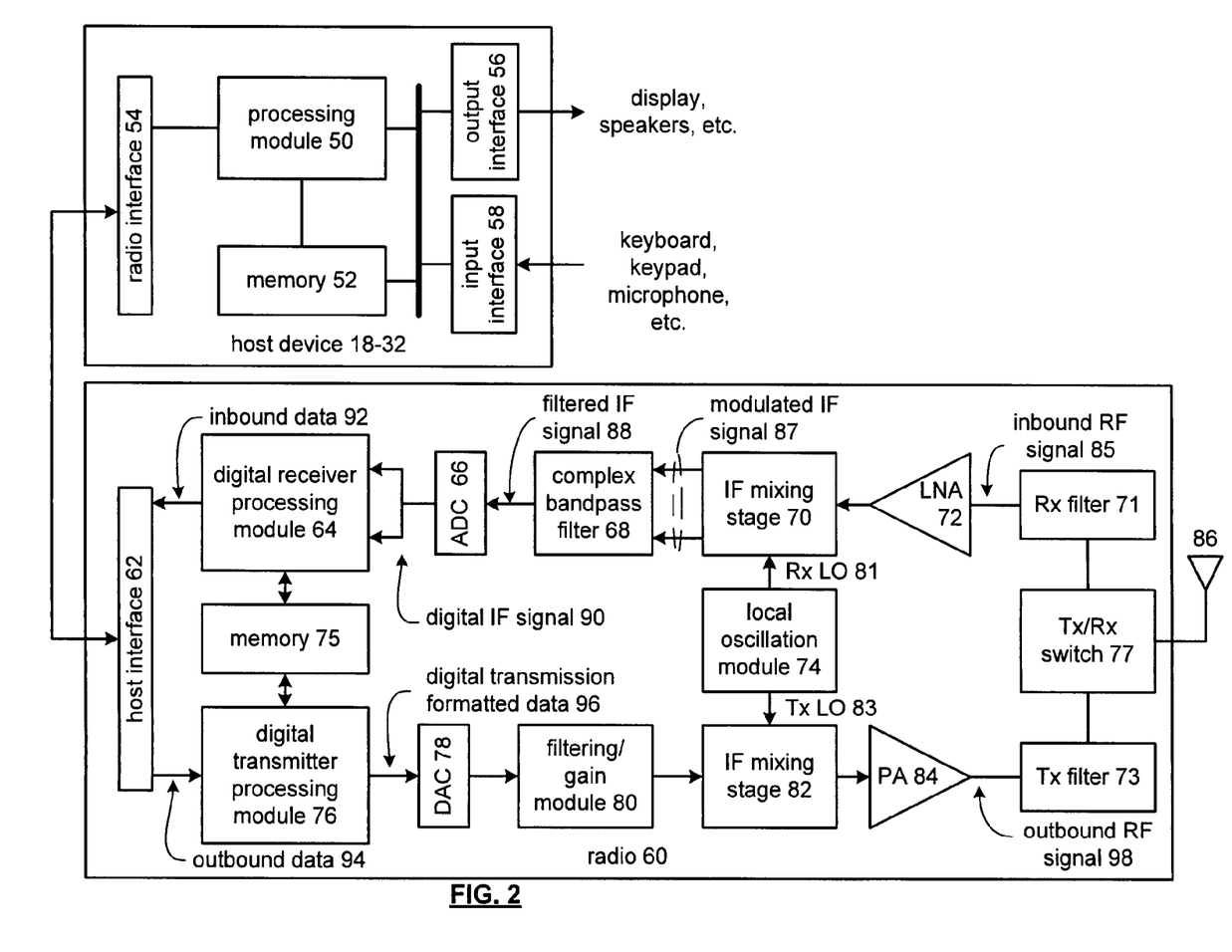
FIG. 2 illustrates a schematic block diagram of a wireless communication device in accordance with the present invention.

FIG. 2 illustrates a schematic block diagram of a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, a single analog-to-digital converter 66, a complex bandpass filter 68, IF mixing stage 70, a receiver filter 71, a low noise amplifier 72, a transmitter filter 73, local oscillation module 74, memory 75, digital transmitter processing module 76, a transmitter/receiver switch 77, digital-to-analog converter 78, filtering/gain module 80, IF mixing stage 82, power amplifier 84, and an antenna 86. The antenna 86 may be a single antenna that is shared by the transmit and receive paths as regulated by the Tx/Rx switch 77, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the processing module 64 and/or 76 executes, operational instructions corresponding to at least some of the functions illustrated in FIGS. 3-6.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE802.11a, IEEE802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74. The power amplifier 84 amplifies the RF signal to produce outbound RF signal 98, which is filtered by the Tx filter 73. The antenna 86 transmits the outbound RF signal 98 to a targeted device such as a base station, an access point and/or another wireless communication device.

The radio 60 also receives an inbound RF signal 85 via the antenna 86, which was transmitted by a base station, an access point, or another wireless communication device. The antenna 86 provides the inbound RF signal 85 to the Rx filter 71 via the Tx/Rx switch 77, where the Rx filter 71 bandpass filters the inbound RF signal 85. The Rx filter 71 provides the filtered RF signal to low noise amplifier 72, which amplifies the signal 88 to produce an amplified inbound RF signal. The low noise amplifier 72 provide the amplified inbound RF signal to the IF mixing module 70, which directly converts the amplified inbound RF signal into an inbound low IF signal based on a receiver local oscillation 81 provided by local oscillation module 74. The down conversion module 70 provides the inbound low IF signal to the complex bandpass filter 68. The complex bandpass filter 68 may be of the type disclosed in copending patent application Ser. No. 09/692,420, entitled "Adaptive Radio Transceiver with Filtering," filed Oct. 19, 2000, now issued as U.S. Pat. No. 7,233,772, on Jun. 19, 2007. In general, the complex bandpass filter 68 filters analog I and Q components to produce a single complex analog signal (e.g., a filtered IF signal 88) that retains the information of the I and Q components.

The single analog-to-digital converter 66 converts the filtered inbound low IF signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

Figure 3:
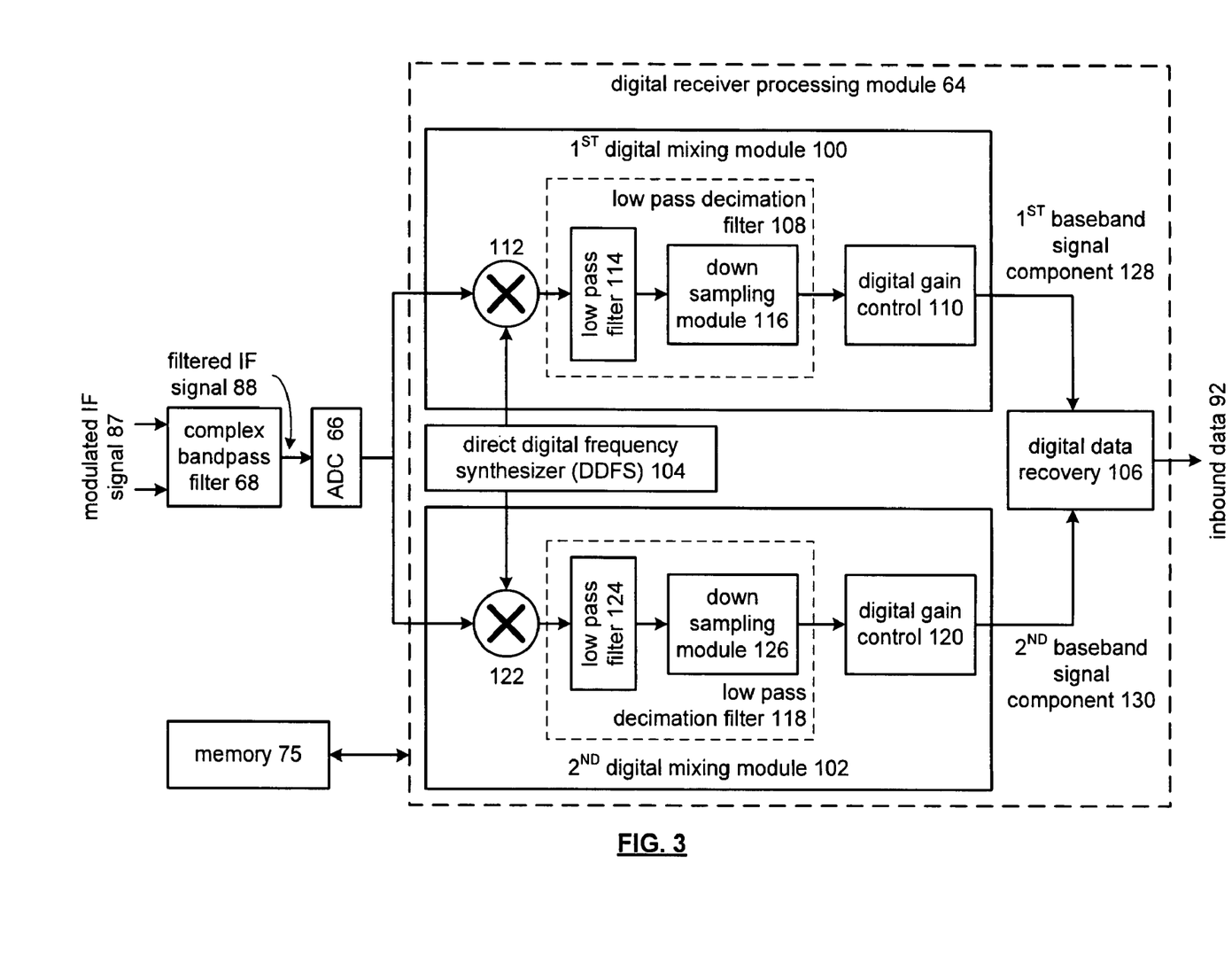
FIG. 3 illustrates a schematic block diagram that further illustrates the receiver section of the wireless communication device of FIG. 2.

FIG. 3 illustrates a schematic block diagram of a portion of the radio receiver of the wireless communication device of FIG. 2. The portion illustrated includes the complex bandpass filter 68, the single analog to digital converter 66, the digital receiver processing module 64 and memory 75. The complex bandpass filter 68, which may be a polyphase filter that filters an I component and a Q component of the modulated IF signal to produce a single filtered IF signal may be described in co-pending patent application Ser. No. 09/692,420, entitled "Adaptive Radio Transceiver with Filtering," filed Oct. 19, 2000, which is now issued as U.S. Pat. No. 7,233,772, on Jun. 19, 2007. The complex bandpass filter 68 provides the filtered IF signal 88 to the analog to digital converter 66. Note that the filtered IF signal 88 is a single signal that contains I and Q information of the modulated IF signal 87.

Figure 4:
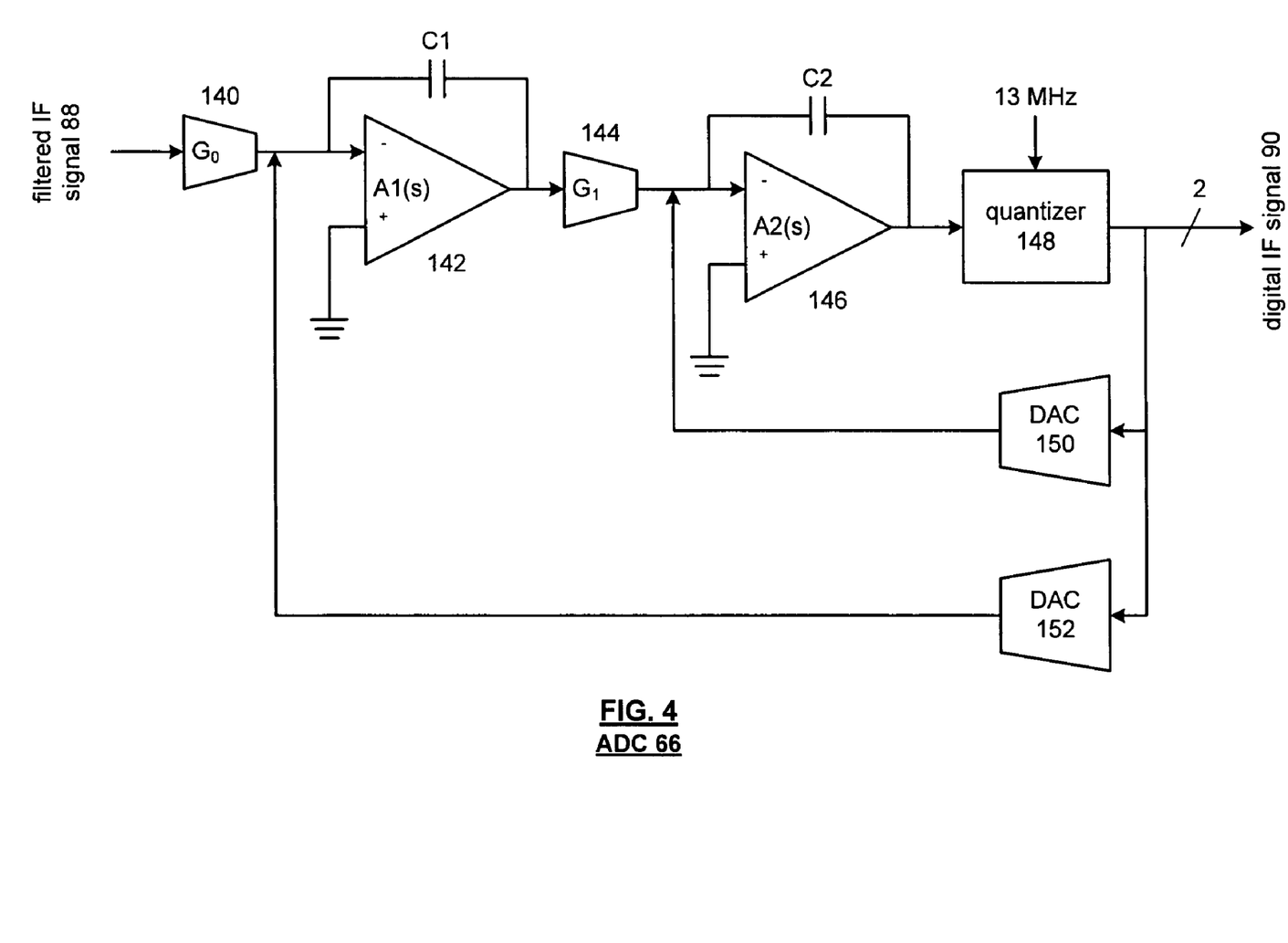
FIG. 4 illustrates a schematic block diagram of an analog to digital converter in accordance with the present invention.

The analog to digital converter 66 converts the filtered IF signal 88 into a digital IF signal. The analog to digital converter 66, may be constructed in accordance with any type of analog to digital converter topology including continuous time Delta Sigma analog to digital converters, flash analog to digital converters. For instance, as illustrated in FIG. 4 and will be described below, the analog to digital converter 66 may be a continuous time Delta Sigma analog to digital converter.

Figure 5:
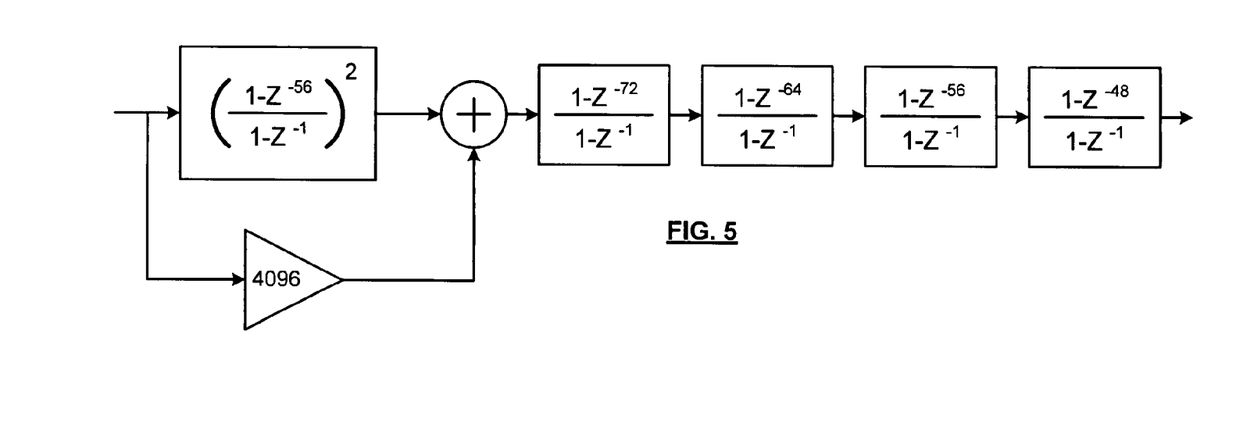
FIG. 5 illustrates a schematic block diagram of a low pass filter in accordance with the present invention.

The digital receiver processing module 64 is configured and/or constructed to include a $1^{st}$ digital mixing module 100, a $2^{nd}$ digital mixing module 102, a direct digital frequency synthesizer (DDFS) 104, and a digital data recovery module 106. The $1^{st}$ digital mixing module 100 includes a digital mixer 112, a low pass decimation filter 108 and a digital gain control module 110. The low pass decimation filter 108 includes a low pass filter 114, which may be implemented as illustrated in FIG. 5, and a down sampling module 116. The $2^{nd}$ digital mixing module 102 includes a digital mixer 122, a low pass decimation filter 118, and a digital gain control module 120. The low pass decimation filter 118 includes a low pass filter 124, which may be implemented as illustrated in FIG. 5, and a down sampling module 126.

In operation, the analog to digital converter 66 provides the digital IF signal to the $1^{st}$ digital mixing module and to the $2^{nd}$ digital mixing module. Within the $1^{st}$ digital mixing module 100, digital mixer 112 mixes the digital IF signal with an in-phase digital local oscillation, which is produced by the direct digital frequency synthesizer 104, to produce a $1^{st}$ mixed signal at baseband. Note that utilizing a lookup table may perform the multiplication performed by the digital mixer via the direct digital frequency synthesizer 104. The low pass decimation filter 108 processes the $1^{st}$ mixed signal via the low pass filter 114 and the down sampling module 116 to produce a decimated mixed signal. The down sampling module 116 may be a down-convert-by-4 module such that the resulting rate of the decimated mixed signal is $1/4^{th}$ of the rate of the $1^{st}$ mixed signal.

The digital gain control module 110 adjusts the magnitude of the decimated mixed signal to produce the $1^{st}$ baseband signal component 128. The gain control module 110 amplifies the baseband signal, i.e., the output of the low pass decimation filter 108, to a level appropriate for baseband processing by the digital data recovery module 106. The appropriate level is at least partially dependent on the particular modulation scheme prescribed by the corresponding wireless communication standard, the supply voltages of the radio frequency integrated circuit embodying the radio receiver of FIG. 3, and/or sensitivity of the circuitry within the digital data recovery module 106.

Within the $2^{nd}$ digital mixing module 102, digital mixer 122 mixes the digital IF signal with a quadrature digital local oscillation, which is produced by the direct digital frequency synthesizer 104, to produce a $2^{nd}$ mixed signal at baseband.

Note that utilizing a lookup table may perform the multiplication performed by the digital mixer via the direct digital frequency synthesizer. The low pass decimation filter 118 processes the $2^{nd}$ mixed signal via the low pass filter 124 and the down sampling module 126 to produce a decimated mixed signal. The down sampling module 126 may be a down-convert-by-4 module such that the resulting rate of the decimated mixed signal is $\frac{1}{4}^{th}$ of the rate of the $2^{nd}$ mixed signal.

The digital gain control module 120 adjusts the magnitude of the decimated mixed signal to produce the $2^{nd}$ baseband signal component 130. The gain control module 120 amplifies the baseband signal, i.e., the output of the low pass decimation filter 118, to a level appropriate for baseband processing by the digital data recovery module 106. The appropriate level is at least partially dependent on the particular modulation scheme prescribed by the corresponding wireless communication standard, the supply voltages of the radio frequency integrated circuit embodying the radio receiver of FIG. 3, and/or sensitivity of the circuitry within the digital data recovery module 106.

The digital data recovery module 106 receives the $1^{st}$ baseband signal component 128 and the $2^{nd}$ baseband signal component 130 and produces therefrom inbound data 92. The digital data recovery module 106 decodes the $1^{st}$ and $2^{nd}$ baseband signal components in accordance with the particular wireless communication standard being implemented by the wireless communication device of FIG. 2.

FIG. 4 illustrates a schematic block diagram of one embodiment of the analog to digital converter 66. In this embodiment, the analog to digital converter is a $2^{nd}$ order continuous time Delta Sigma modulator. As shown, the analog to digital converter 66 includes $1^{st}$ and $2^{nd}$ gain stages 140 and 144, $1^{st}$ and $2^{nd}$ integrators 142 and 146, a quantizer 148 and $1^{st}$ and $2^{nd}$ digital to analog converters 150 and 152. As configured, the analog to digital converter 66 receives the filtered IF signal 88 and produces a 2-bit digital IF signal 90. The quantization may be performed at 13 MHz. As one of average skill in the art will appreciate, the quantization rate may vary from the 13 MHz as well as the order of the continuous time Delta Sigma modulator.

FIG. 5 illustrates an embodiment of the low pass filters 114 and 124 and includes a differentiation module and a plurality of cascaded comb filters to provide the low pass filtering. As one of average skill in the art will appreciate, the number of cascaded comb filters may vary from those shown as well as the order of the low pass filter.

Figure 6:
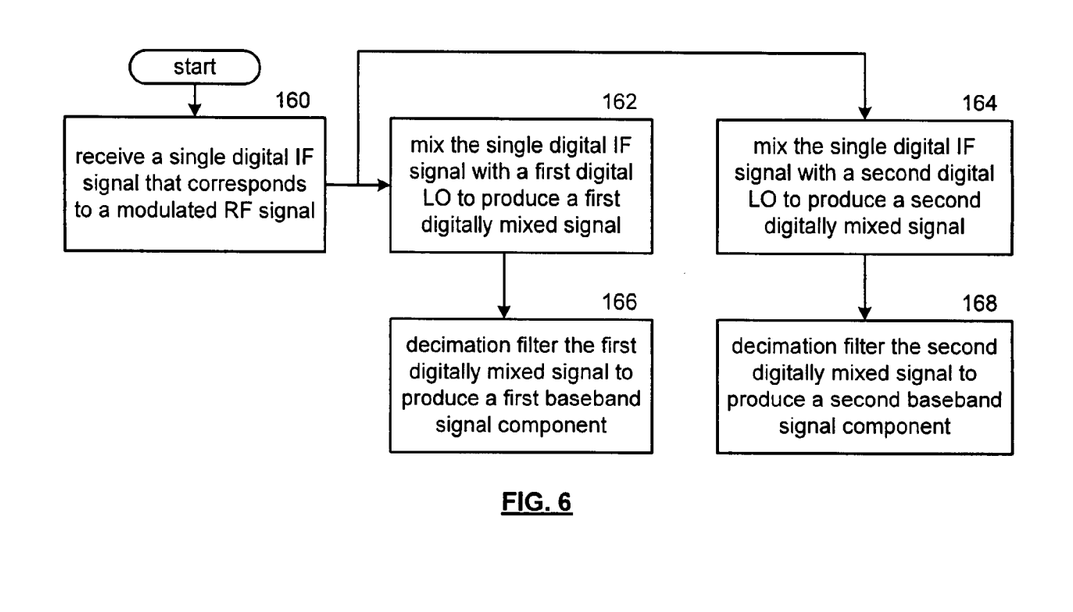
FIG. 6 illustrates a logic diagram of a method for processing intermediate frequency signals from a single analog to digital converter in accordance with the present invention.

FIG. 6 illustrates a logic diagram of a method for intermediate frequency to baseband conversion from a single digital IF signal. The process begins at Step 160 where a single digital IF signal that corresponds to a modulated RF signal is received. For instance, the single digital IF signal may be received from a single analog to digital converter that has converted a filtered IF signal into the single digital IF signal. The filtered IF signal may be produced by a complex bandpass filter that filtered an I and Q component of the modulated IF signal, which is representative of the modulated RF signal.

The process then proceeds to Steps 162 and 164. At Step 162, the single digital IF signal is mixed with a $1^{st}$ digital local oscillation to produce a $1^{st}$ digitally mixed signal. At Step 164, the single digital IF signal is mixed with a $2^{nd}$ digital local oscillation to produce a $2^{nd}$ digitally mixed signal.

The process proceeds from Step 162 to Step 166 where the $1^{st}$ digitally mixed signal is decimation filtered to produce a .sub.1St baseband component signal. The decimation filtering may be done by low pass filtering the digitally mixed signal to produce a low pass filtered signal. The low pass filter signal may then be down sampled to produce the $1^{st}$ baseband signal component.

From Step 164, the process proceeds to Step 168 where the $2^{nd}$ digitally mixed signal is decimation filtered to produce a $2^{nd}$ baseband signal component. The decimation filtering may be done by low pass filtering the $2^{nd}$ digitally mixed signal to produce a filtered signal. The filtered signal is then down sampled to produce the $2^{nd}$ baseband signal component.

The preceding discussion has presented a radio receiver that utilizes a single analog to digital converter, which reduces power consumption, reduces integrated circuit size, and provides other benefits. As one of average skill in the art will appreciate, other embodiments may be derived from the teaching of the present invention, without deviating from the scope of the claims.

As also may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

What is claimed is:

1. A radio receiver comprises:

an analog to digital converter coupled to convert an Intermediate Frequency (IF) signal into a digital IF signal, wherein the IF signal includes information regarding an in-phase component and a quadrature component of a modulated RF signal;

a first digital mixing module coupled to process the digital IF signal with an in-phase digital local oscillation to produce a first baseband signal component;

a second digital mixing module coupled to process the digital IF signal with a quadrature digital local oscillation to produce a second baseband signal component; and a complex bandpass filter coupled to filter the in-phase component and the quadrature component of the modulated RF signal.

2. The radio receiver of claim 1, wherein:

the radio receiver is one of a laptop host computer, a personal digital assistant host, a personal computer host, and a cellular telephone host.

3. The radio receiver of claim 1, wherein the analog to digital converter further comprises:

a continuous time delta sigma analog to digital converter; or a flash analog to digital converter.

4. The radio receiver of claim 1, wherein the first digital mixing module comprises:

a digital mixer coupled to mix the digital IF signal with the in-phase digital local oscillation to produce a first mixed signal;

a low pass decimation filter coupled to process the first mixed signal to produce a decimated mixed signal; and a digital gain control module coupled to adjust magnitude of the decimated mixed signal to produce the first baseband signal component.

5. The radio receiver of claim 4, wherein the low pass decimation filter comprises:

a low pass filter coupled to low pass filter the first mixed signal to produce a filtered mixed signal; and a down sampling module coupled to down sample the filtered mixed signal to produce the decimated mixed signal.

6. The radio receiver of claim 1, wherein the second digital mixing module comprises:

a digital mixer coupled to mix the digital IF signal with the quadrature digital local oscillation to produce a second mixed signal;

a low pass decimation filter coupled to process the second mixed signal to produce a decimated mixed signal; and a digital gain control module coupled to adjust magnitude of the decimated mixed signal to produce the second baseband signal component.

7. The radio receiver of claim 6, wherein the low pass decimation filter comprises:

a low pass filter coupled to low pass filter the second mixed signal to produce a filtered mixed signal; and a down sampling module coupled to down sample the filtered mixed signal to produce the decimated mixed signal.

8. A method for digital intermediate frequency (IF) to baseband conversion from a single IF signal, the method comprises:

receiving the single IF signal;

employing an analog-to-digital converter to perform analog-to-digital converting of the single IF signal into a single digital IF signal, wherein the single digital IF signal includes information regarding an in-phase component and a quadrature component of a modulated RF signal;

mixing the single digital IF signal with a first digital local oscillation to produce a first digitally mixed signal;

mixing the single digital IF signal with a second digital local oscillation to produce a second digitally mixed signal;

decimation filtering the first digitally mixed signal to produce a first baseband signal component; and decimation filtering the second digitally mixed signal to produce a second baseband signal component; and wherein:

the decimation filtering of the first digitally mixed signal includes:

low pass filtering the first digitally mixed signal to produce a filtered signal; and down sampling the filtered signal to produce the first baseband signal component.

9. The method of claim 8 further comprises:

adjusting gain of the first baseband signal component in accordance with baseband processing; and adjusting gain of the second baseband signal component in accordance with the baseband processing.

10. The method of claim 8, wherein:

the method is performed within one of a laptop host computer, a personal digital assistant host, a personal computer host, and a cellular telephone host.

11. The method of claim 8, wherein the decimation filtering of the second digitally mixed signal comprises:

low pass filtering the second digitally mixed signal to produce a filtered signal; and down sampling the filtered signal to produce the second baseband signal component.

12. An apparatus for digital intermediate frequency (IF) to baseband conversion from a single IF signal, the apparatus comprises:

processing module; and memory coupled to the processing module, wherein the memory includes operational instructions that cause the processing module to:

receive the single IF signal;

perform analog-to-digital converting of the IF signal into a single digital IF signal, wherein the single digital IF signal includes information regarding an in-phase component and a quadrature component of a modulated radio frequency (RF) signal;

mix the single digital IF signal with a first digital local oscillation to produce a first digitally mixed signal;

mix the single digital IF signal with a second digital local oscillation to produce a second digitally mixed signal;

decimation filter the first digitally mixed signal to produce a first baseband signal component; and decimation filter the second digitally mixed signal to produce a second baseband signal component; and wherein:

the memory comprises operational instructions that cause the processing module to decimation filter the first digitally mixed signal by:

low pass filtering the first digitally mixed signal to produce a filtered signal; and down sampling the filtered signal to produce the first baseband signal component.

13. The apparatus of claim 12, wherein the memory further comprises operational instructions that cause the processing module to:

adjust gain of the first baseband signal component in accordance with baseband conversion; and adjust gain of the second baseband signal component in accordance with the baseband conversion.

14. The apparatus of claim 12, wherein:

the apparatus is one of a laptop host computer, a personal digital assistant host, a personal computer host, and a cellular telephone host.

15. The apparatus of claim 12, wherein the memory comprises operational instructions that cause the processing module to decimation filter the second digitally mixed signal by:

low pass filtering the second digitally mixed signal to produce a filtered signal; and down sampling the filtered signal to produce the second baseband signal component.

* * * * *